(12) United States Patent
Mani et al.

(10) Patent No.: US 11,112,841 B2
(45) Date of Patent: Sep. 7, 2021

(54) 5G MMWAVE COOLING THROUGH PCB

(71) Applicant: Intel Corporation, Santa Clara, CA (US)

(72) Inventors: Divya Mani, Chandler, AZ (US); William J. Lambert, Chandler, AZ (US); Shawna Liff, Scottsdale, AZ (US); Sergio A. Chan Arguedas, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/481,396

(22) PCT Filed: Apr. 1, 2017

(86) PCT No.: PCT/US2017/025664
§ 371 (c)(1),
(2) Date: Jul. 26, 2019

(87) PCT Pub. No.: WO2018/182756
PCT Pub. Date: Oct. 4, 2018

(65) Prior Publication Data
US 2019/0377392 A1     Dec. 12, 2019

(51) Int. Cl.
*G06F 1/20* (2006.01)
*H05K 1/02* (2006.01)
(Continued)

(52) U.S. Cl.
CPC ............. *G06F 1/203* (2013.01); *H01Q 23/00* (2013.01); *H04B 1/40* (2013.01); *H05K 1/0204* (2013.01); *H05K 1/141* (2013.01); *H05K 3/0061* (2013.01)

(58) Field of Classification Search
CPC ....... H01L 2924/00; H01L 2924/00014; H01L 2224/32225; H01L 2224/16225;
(Continued)

(56) References Cited

U.S. PATENT DOCUMENTS

2002/0135065 A1* 9/2002 Zhao ................... H01L 23/3677
257/738
2003/0206401 A1* 11/2003 Zhou ...................... H05K 3/341
361/719

(Continued)

OTHER PUBLICATIONS

International Preliminary Report on Patentability for International Patent Application No. PCT/US2017/025664, dated Oct. 10, 2019, 10 pages.
(Continued)

*Primary Examiner* — Adam B Dravininkas
(74) *Attorney, Agent, or Firm* — Schwabe, Williamson & Wyatt, P.C.

(57) ABSTRACT

Embodiments of the invention include a mmWave transceiver and methods of forming such devices. In an embodiment, the mmWave transceiver includes an RF module. The RF module may include a package substrate, a plurality of antennas formed on the package substrate, and a die attached to a surface of the package substrate. In an embodiment, the mmWave transceiver may also include a mainboard mounted to the RF module with one or more solder balls. In an embodiment, a thermal feature is embedded within the mainboard, and the thermal feature is separated from the die by a thermal interface material (TIM) layer. According to an embodiment, the thermal features are slugs and/or vias. In an embodiment, the die compresses the TIM layer resulting in a TIM layer with minimal thickness.

14 Claims, 7 Drawing Sheets

(51) Int. Cl.
*H05K 1/14* (2006.01)
*H05K 3/00* (2006.01)
*H01Q 23/00* (2006.01)
*H04B 1/40* (2015.01)

(58) Field of Classification Search
CPC . H01L 2224/73265; H01L 2224/73204; H01L 2224/48227; H01L 2924/15311; H01L 2924/00012; H01L 2224/48091; H01L 2924/181; H01L 2924/0002; H05K 3/0061; H05K 1/0204; H05K 1/142; H05K 1/0203; H05K 7/2039; H05K 7/20409; H05K 1/0209; G06F 1/203; H04B 1/40; H01Q 23/00
See application file for complete search history.

(56) References Cited

U.S. PATENT DOCUMENTS

| | | | | |
|---|---|---|---|---|
| 2004/0112636 A1* | 6/2004 | Kawai | ............... | H05K 3/061 174/263 |
| 2004/0264138 A1 | 12/2004 | Dias et al. | | |
| 2005/0245060 A1* | 11/2005 | Chiu | ............... | H01L 23/3677 438/612 |
| 2005/0280141 A1* | 12/2005 | Zhang | ............... | H01L 23/49816 257/707 |
| 2007/0231953 A1* | 10/2007 | Tomita | ............... | H01L 24/18 438/106 |
| 2012/0063094 A1* | 3/2012 | Gaynes | ............... | H05K 3/30 361/707 |
| 2012/0159118 A1* | 6/2012 | Wong | ............... | H01L 25/105 712/1 |
| 2014/0321804 A1* | 10/2014 | Thacker | ............... | H01L 25/0655 385/14 |
| 2014/0327129 A1* | 11/2014 | Cho | ............... | H01L 23/552 257/713 |
| 2015/0137345 A1* | 5/2015 | Choi | ............... | H01L 23/04 257/713 |
| 2016/0027717 A1 | 1/2016 | Jiang et al. | | |
| 2017/0207204 A1* | 7/2017 | Lin | ............... | H01L 24/19 |
| 2018/0218986 A1* | 8/2018 | Kamgaing | ............... | H01L 25/16 |

OTHER PUBLICATIONS

International Search Report and Written Opinion for International Patent Application No. PCT/US2017/025664 dated Dec. 28, 2017, 13 pgs.

* cited by examiner

5G MMWAVE COOLING THROUGH PCB

CROSS-REFERENCE TO RELATED APPLICATION

This patent application is a U.S. National Phase Application under 35 U.S.C. § 371 of International Application No. PCT/US2017/025664, filed Apr. 1, 2017, entitled "5G mmWAVE COOLING THROUGH PCB," which designates the United States of America, the entire disclosure of which is hereby incorporated by reference in its entirety and for all purposes.

FIELD OF THE INVENTION

Embodiments of the invention are in the field of mmWave transceivers and, in particular, low-cost mmWave transceivers with thermal features integrated into the mainboard.

BACKGROUND OF THE INVENTION

Methods for manufacturing mmWave transceiver systems for phones, tablets, and laptops, as well as small base stations ("pico cells") at low cost must be developed in order for the market to adopt mmWave communications products. A mmWave packaging concept currently of major interest in the industry is to place the die and second level interconnect (SLI) on the bottom side of the package, directly under the antenna layers implemented in the top layer of the package to form a compact, low cost RF module using organic prepreg packaging. However, high power requirements in these kind of packages leads to bigger cooling challenges because the die is now on the SLI side of the package, where it cannot be cooled from the top as would be done for a conventional flip-chip package. For current RF module designs the die is cooled using heat sinks directly in contact with the chip with through holes in the PCB mainboard, which could result in manufacturing/assembly difficulties and thereby increased cost.

DETAILED DESCRIPTION OF THE INVENTION

Described herein are mmWave transceiver systems that include embedded thermal features in the mainboard and methods of forming such mmWave transceiver systems. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
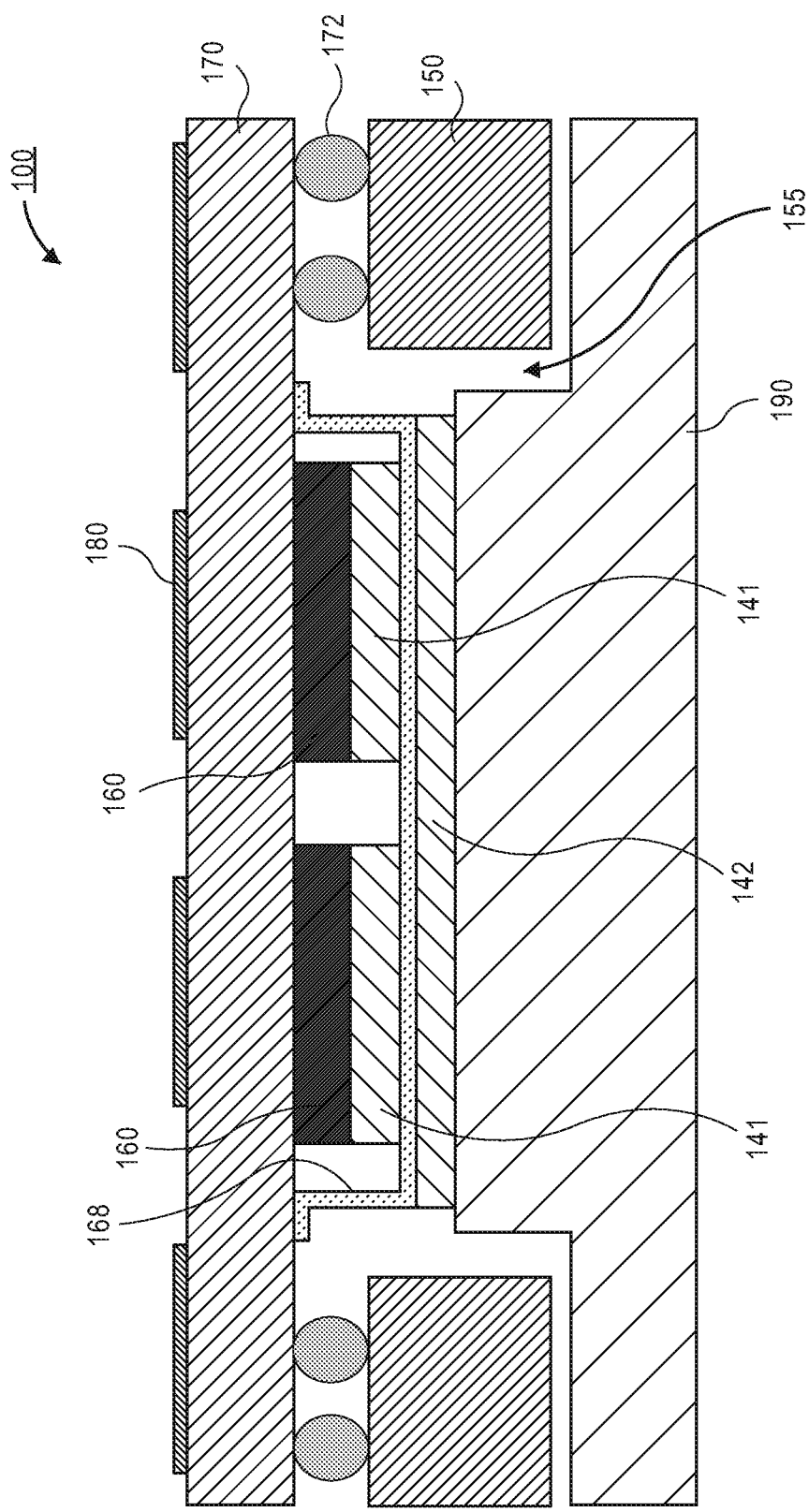
FIG. 1 is a cross-sectional illustration of a mmWave transceiver system that includes a hole through the mainboard through which a heatsink passes to provide thermal control of dies mounted on the mmWave package.

As noted above, current systems for low-cost mmWave transceivers require a hole in the mainboard through which a heatsink, heat pipe, or other thermal solution either directly contact the die, or contact an electromagnetic interference (EMI) shield or integrated heat spreader (IHS) which is in thermal contact with the die. An example of such a configuration is shown in the cross-sectional illustration in FIG. 1. As shown in FIG. 1, the RF module includes a plurality of antennas 180 formed on a package substrate 170. The dies 160 are formed over a bottom surface of the package substrate 170. An EMI shield 168 is formed over the dies 160 and is thermally coupled to the dies by a TIM layer 141. In order to allow for a heat sink 190 to mate with the EMI shield 168 over the die 160, a hole 155 is formed through the mainboard 150. The heat sink 190 is separated from the EMI shield 168 by a second TIM layer 142. However, this configuration has a number of potential issues when used for a low-cost, volume product. One such problem is that low-cost heat sinks 190 and EMI shields 168 are used. This is problematic because there will likely be large tolerances in the thickness of the TIM layers since the components are not fabricated with highly controlled and precise package processing technologies. Accordingly, the TIM layers 141 and 142 will have to be very thick and compliant. The increased thickness of the TIM layers 141 and 142 results in a high thermal resistance between the dies 160 and the heat sink 190 and forces a reduction in the thermal design point (TDP). With this configuration, an EMI shield 190 and/or heat sink 190 with much thinner TIM layers 141 and 142

(and hence lower thermal resistance) requires precise tolerances in the vertical dimension of FIG. 1, which requires more costly machining and assembly techniques. Accordingly, the use of such configurations does not allow for low cost mmWave transceivers.

Accordingly, embodiments of the present invention transfer the heat effectively from the die on the bottom side of the package to a heat sink on the backside of a mainboard by a low thermal resistance path composed of a thin bondline TIM and slugs and/or thermal vias formed through the thickness of the mainboard. To reduce the die temperatures, the thermal resistance from the die to bottom of the board should be minimal. Additionally, a heat sink or plate attached to the bottom side of the mainboard may aid in the transfer of the heat to the ambient, thereby maintaining the die within the junction temperature (Tj) limit.

By transferring heat directly from the die through the mainboard, no holes in the mainboard are required. Furthermore, the assembly process used to form embodiments of the invention will result in a thin TIM layer. Accordingly, the thermal performance is expected to be improved over the configurations requiring holes through the mainboard. The opposite side of the mainboard can then be directly attached to an actively or passively cooled heat sink, which can be flat, and hence easy and low cost to manufacture.

Figure 2A:
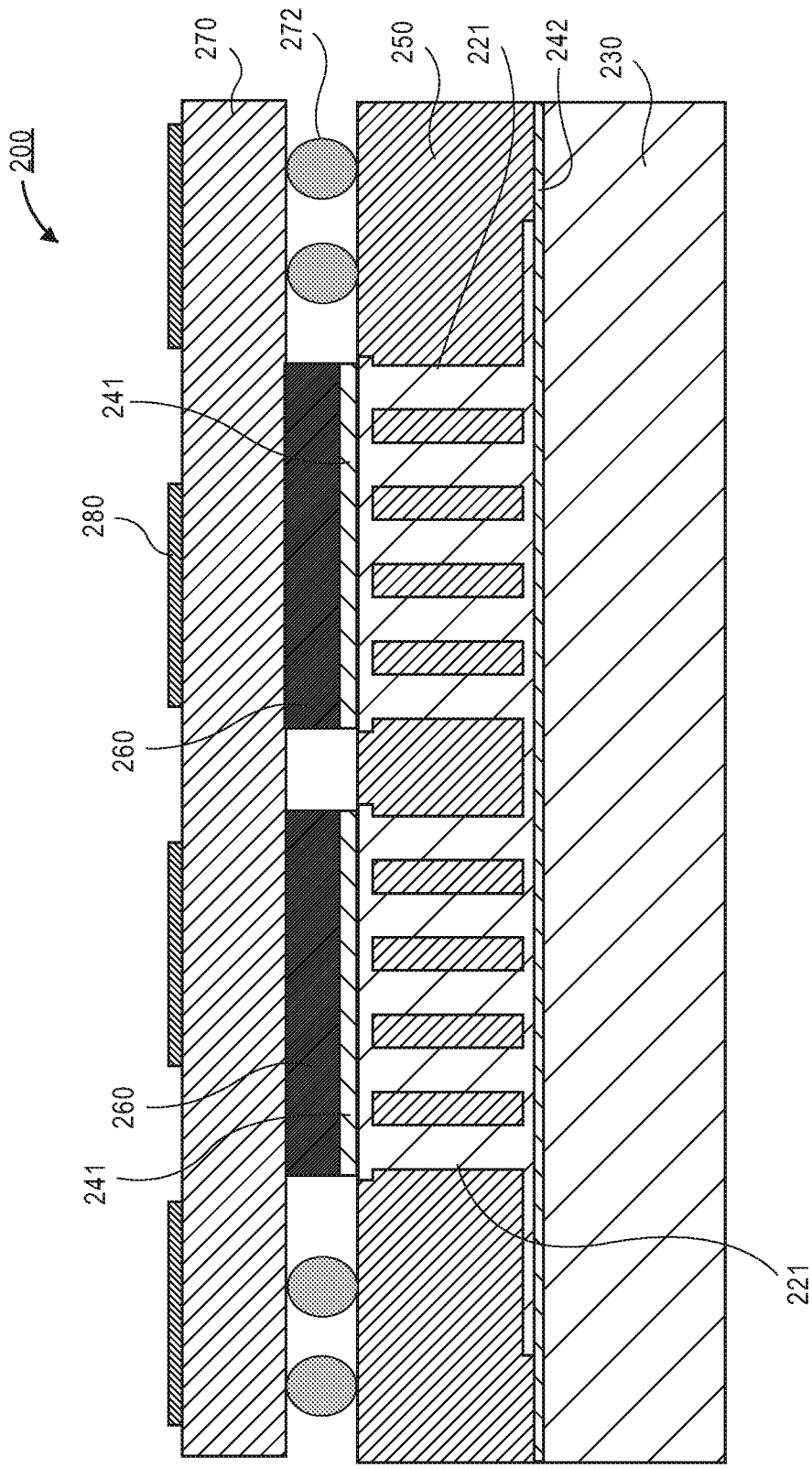
FIG. 2A is a cross-sectional illustration of a mmWave transceiver system that includes a plurality of thermal vias through the mainboard to provide thermal control of dies mounted on the mmWave package, according to an embodiment of the invention.

Referring now to FIG. 2A, a cross-sectional illustration of a mmWave transceiver 200 is shown according to an embodiment of the invention. According to an embodiment, the mmWave transceiver 200 may include an RF module that is coupled to a mainboard 250. The mmWave transceiver 200 may include a plurality of antennas 280 for transmitting and/or receiving radio frequencies that are positioned over or within a package substrate 270. In the illustrated embodiment, the antennas 280 are shown as being on a top surface of the package substrate 270, though it is to be appreciated that the antennas may be covered with solder mask, dielectric, or the like, and are omitted for clarity. In a particular embodiment, the antennas 280 may be used for transmitting and/or receiving mmWave frequencies (e.g., frequencies between approximately 30 GHz and 300 GHz). In some embodiments, the mmWave frequencies may be used in 5G communication networks. In an embodiment, the package substrate 270 may include typical organic packaging materials, such as layers of acrylonitrile butadiene styrene (ABS) or prepreg separated by a core material. Additionally, one or more layers of electrical routing (not shown) may be included in the packaging to communicatively couple components in the system.

In an embodiment, one or more dies 260 may be mounted to a surface of the package substrate 270 opposite from the antennas 280. As illustrated in FIG. 2A, the two dies 260 are mounted on a bottom surface of the package substrate 270. The package substrate may be electrically coupled to a mainboard 250 by a plurality of second level interconnects (SLI), such as ball grid array (BGA) balls 272. In an embodiment, the size of the BGA balls may be chosen so that after a reflow process (described in greater detail below), the dies 260 compress the TIM 241 to a specified thickness. For example, the BGA balls 272 may be between approximately 500 μm and 750 μm. In a particular embodiment, the BGA balls 272 may be between approximately 630 μm and 700 μm.

In an embodiment, the main board may include additional components for processing signals, such as voltage regulators, crystal oscillators, CPUs, memory, baseband processors, low frequency RF transceivers, or the like. According to an embodiment, the RF module is fed a baseband or intermediate frequency (IF) signal from the mainboard which is mixed to mmWave frequencies, amplified, then transmitted by the antennas 280. In an embodiment, the mixing and amplification may be implemented partially or entirely by one or more of the dies 260. Similarly, the reverse operation may be used for receiving mmWave signals.

In order to regulate the temperature of the dies 260, embodiments of the invention may include a plurality of thermal features that are formed through the mainboard 250. Integrating the thermal features within the mainboard 250 provides significant advantages over forming a hole through the mainboard, as described above. Particularly, the inclusion of integrated thermal features eliminates the need for a discrete heat sink. Instead, the integrated thermal features may be fabricated with more precise packaging processes, thereby allowing the tolerances of the integrated thermal features to be reduced with respect to the discretely fabricated heat sink.

Accordingly, the thickness of the TIM 241 between the dies 260 and the integrated thermal features may be reduced. For example, the thickness of the TIM 241 may be less than approximately 50 μm. In an embodiment, the thickness of the TIM 241 may be approximately equal to the average size of the fillers within the TIM 241. In a particular embodiment, the thickness of the TIM 241 may be less than approximately 40 μm. Decreasing the thickness of the TIM 241 reduces the thermal resistance between the dies 260 and the thermal features, and therefore, improves the transfer of thermal energy away from the dies 260. As will be described in greater detail below, the thickness of the TIM 241 may be reduced by applying pressure to the RF module during reflow of the BGA balls 272.

In one embodiment, the integrated thermal features may include a plurality of thermally conductive vias 221 formed through the mainboard 250. For example, the conductive vias may be any thermally conductive material, such as copper or other metals. In an embodiment, the plurality of vias 221 may be formed with existing printed circuit board (PCB) fabrication technologies. In the illustrated embodiment, five vias 221 are formed below each die 260, however, it is to be appreciated that any number of vias 221 (i.e., one or more vias 221) may be formed below each die 260.

Embodiments may also include a heat spreader 230 formed on the opposite surface of the mainboard 250. In an embodiment, the heat spreader 230 may be a passively cooled thermal device, or the heat spreader 230 may be an actively cooled thermal device. In the particular embodiment illustrated in FIG. 2A, the heat spreader 230 is a thermally conductive plate (e.g., a copper plate). However, embodiments may also include any shaped heat spreader 230, such as a heat spreader with fins or other features that may improve thermal regulation. In the illustrated embodiment, the heat spreader 230 has a footprint that is substantially equal to the footprint of the mainboard 250. However, embodiments may include a heat spreader 230 that has any sized footprint, depending on the needs of the device.

According to an embodiment, the heat spreader 230 may be a discrete component that is mounted to the main board 230. In such embodiments, the heat spreader 230 may be thermally coupled to the integrated thermal features by a second TIM layer 242. Similar to above, the TIM layer may be a relatively thin TIM layer 242 due to the improved tolerances of the integrated thermal features and due to the pressure applied during attachment of the heat spreader 230 to the mainboard 250. For example, the second TIM layer 242 may be less than approximately 50 μm thick. In an additional embodiment, the second TIM layer 242 may be less than approximately 40 μm thick.

Figure 2B:
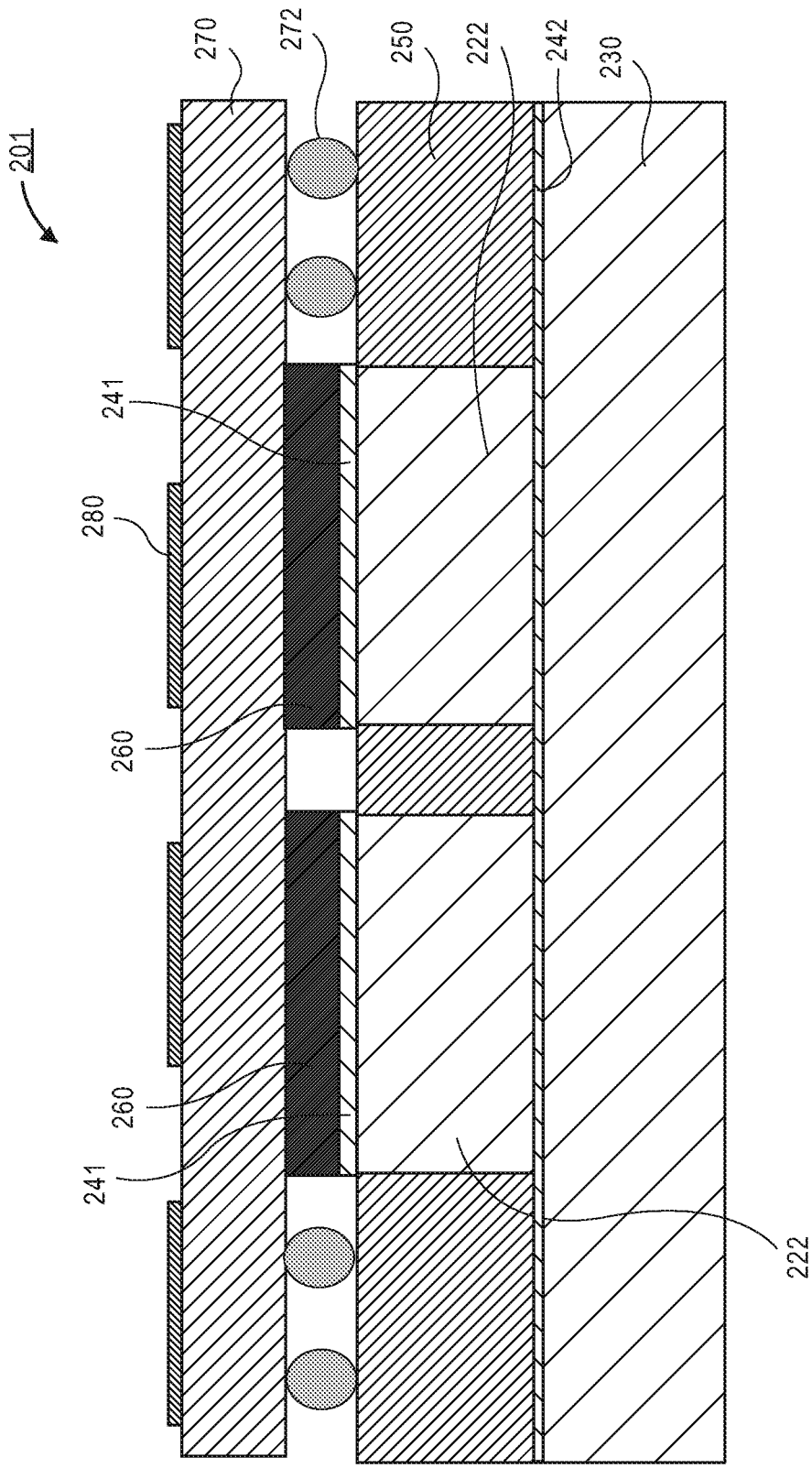
FIG. 2B is a cross-sectional illustration of a mmWave transceiver system that includes a thermally conductive slug through the mainboard to provide thermal control of dies mounted on the mmWave package, according to an embodiment of the invention.

Referring now to FIG. 2B, a cross-sectional illustration of a mmWave transceiver 201 is shown, according to an additional embodiment of the invention. The mmWave transceiver 201 is substantially similar to the mmWave transceiver 200, with the exception that the integrated thermal features in the mainboard 230 are plugs 222 instead of vias 221. In an embodiment, the plugs 222 may be a thermally conductive material, such as copper or any other metal. The plugs 222 may be formed with existing PCB fabrication processes. Due to the larger cross-section compared to the vias 221, the plugs 222 may reduce the thermal resistance compared to embodiments where vias 221 are used. While FIGS. 2A and 2B show different integrated thermal features, it is to be appreciated that embodiments of the invention may include combinations of plugs 222, vias 221, or any other thermal pathway through the mainboard 230.

Figure 2C:
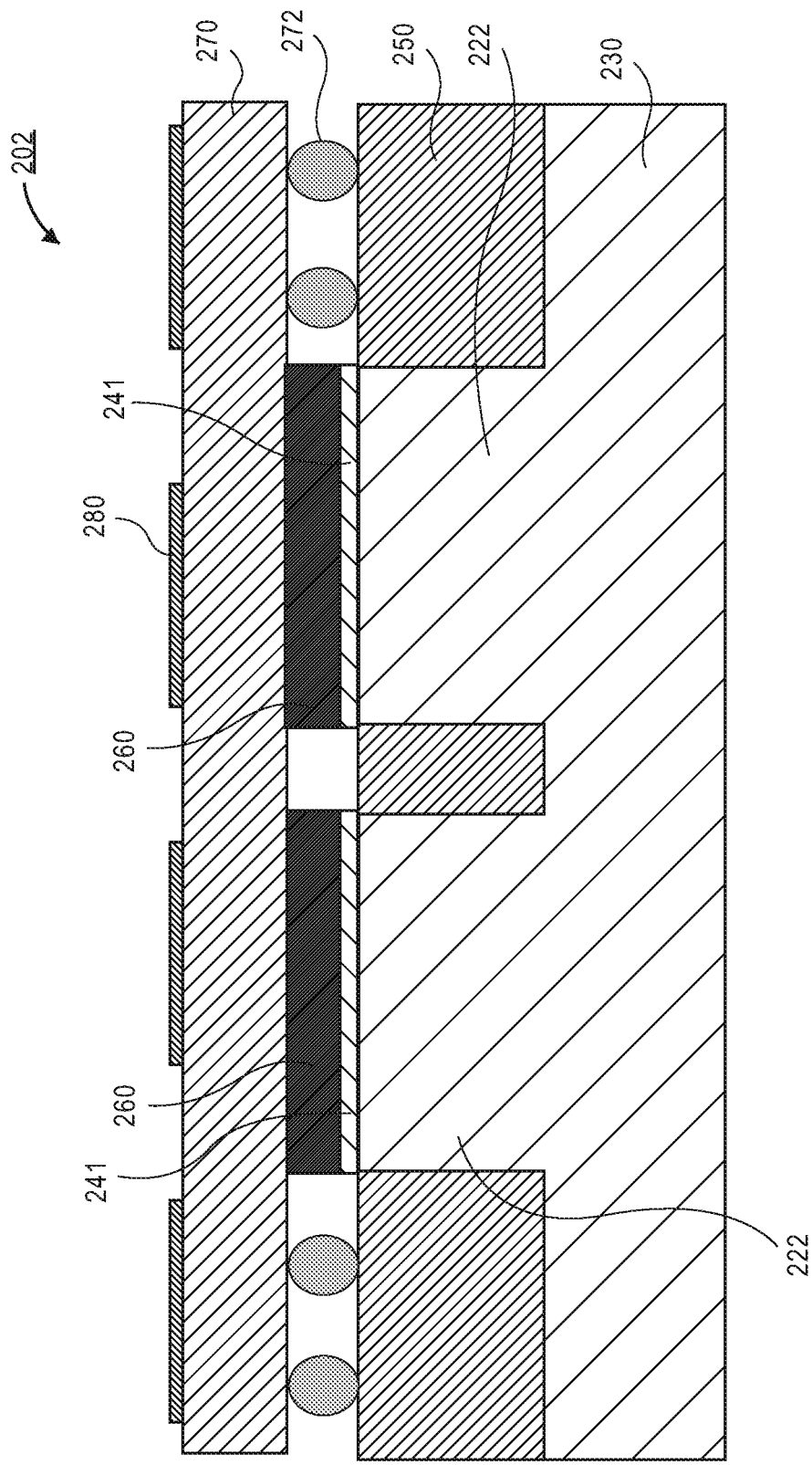
FIG. 2C is a cross-sectional illustration of a mmWave transceiver system that includes a thermal feature embedded in the mainboard and directly coupled to a heatsink without thermal interface material, according to an embodiment of the invention.

Referring now to FIG. 2C, a cross-sectional illustration of a mmWave transceiver 202 is shown, according to an additional embodiment of the invention. The mmWave transceiver 202 is substantially similar to the mmWave transceiver 201 illustrated in FIG. 2B, with the exception that the heat spreader 230 is also integrated with the mainboard 230. For example, a copper plate may be plated over the backside of the mainboard 230 with known PCB fabrication processes. Such an embodiment is beneficial because it allows for the second TIM layer 242 to be removed. Accordingly, the thermal resistance of the system is reduced. In embodiments where the heat spreader 230 and the integrated thermal features (e.g., a plug 222 or a via 221) are the same material, the heat spreader 230 and the thermal feature 222 may be considered to be a single component since there is no discernable junction between the two. In an additional embodiment, the heat spreader 230 and the thermal features (e.g., a plug 222 or via 221) may be different materials, and a clear junction between the two components may be discernable even when the heat spreader 230 is integrated with the mainboard 250.

Referring now to FIGS. 3A-3D, a process flow for forming a mmWave transceiver is shown, according to embodiments of the invention. Particularly, embodiments of the invention include a process flow for forming a mmWave transceiver that allows for the thickness of the TIM layer between the dies and the integrated thermal features to be minimized. The minimization of the thickness of the TIM layer is enabled by applying pressure to the RF module during reflow of the BGA balls. As such, the dies compress the TIM layer until they bottom out (i.e., the dies compress the TIM layer as much as possible, leaving a TIM layer that has a thickness approximately equal to the average size of the filler particles in the TIM). By reducing the thickness of the TIM layer, the thermal resistance is reduced and the removal of thermal energy from the dies is improved.

Figure 3A:
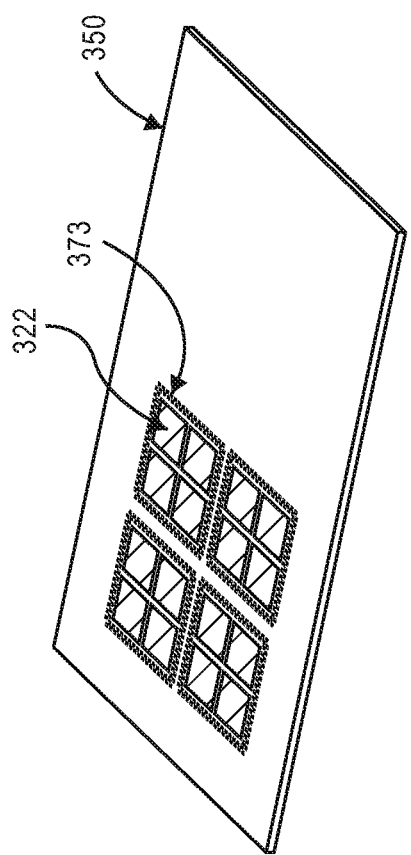
FIG. 3A is a perspective view illustration of a mainboard for a mmWave transceiver system that includes a plurality of embedded thermal features, according to an embodiment of the invention.

Referring now to FIG. 3A, a perspective view of the mainboard 350 is shown, according to an embodiment of the invention. As illustrated, the mainboard 350 may include a plurality of thermal features 322 integrated into the mainboard 350, as described above. In the illustrated embodiment, the thermal features 322 are plugs, but it is to be appreciated that embodiments may use vias with substantially the same process. In an embodiment, a plurality of pads 373 may be formed around the thermal features 322. The pads 373 may be pads on which BGA balls 372 will be placed in order to communicatively couple the mainboard 350 to the RF module.

Figure 3B:
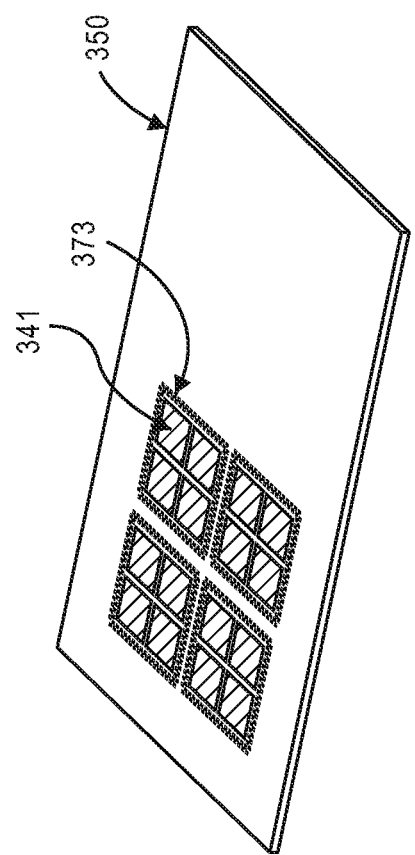
FIG. 3B is a perspective view illustration of the mainboard for a mmWave transceiver system after a thermal interface material is formed over the embedded thermal features, according to an embodiment of the invention.

Referring now to FIG. 3B, a perspective view of the mainboard 350 after a TIM layer 341 is printed over the thermal features 322 is shown, according to an embodiment of the invention. In an embodiment, the TIM layer 341 may be printed over the thermal features with any suitable process, such as stencil printing, ink jetting, or the like. In an embodiment, BGA balls (not shown) may also be formed over the pads 373. The BGA balls may be placed (e.g., pick and placed) or stencil printed onto the pads.

Figure 3C:
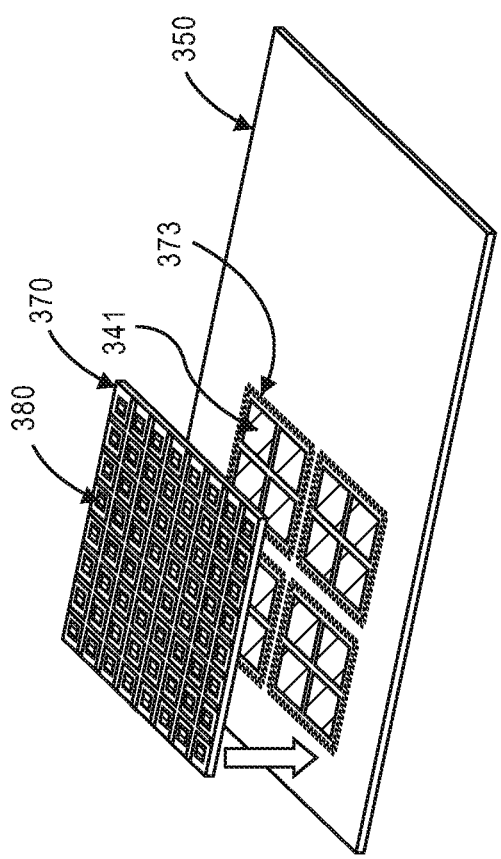
FIG. 3C is a perspective view illustration of an RF module being placed on the mainboard, according to an embodiment of the invention.

Referring now to FIG. 3C, a perspective view of the system is shown as the RF module 370 is positioned and placed (as indicated by the arrow) onto the mainboard 350, according to an embodiment of the invention. In an embodiment, the RF module may be placed onto the mainboard 350 so that the dies (mounted to the bottom of the RF module and not visible) are aligned over TIM layer 341 formed over the integrated thermal features. In an embodiment, the BGA balls may also be formed on the bottom side of the RF module 370 so that they are positioned on the pads 373 when the RF module 370 is placed on the mainboard 350. In the illustrated embodiment, a plurality of antennas 380 are formed on the top surface of the RF module 370, though it is to be appreciated that the antennas 380 may be embedded within the RF module, or covered by layers of other material, as is described above.

Figure 3D:
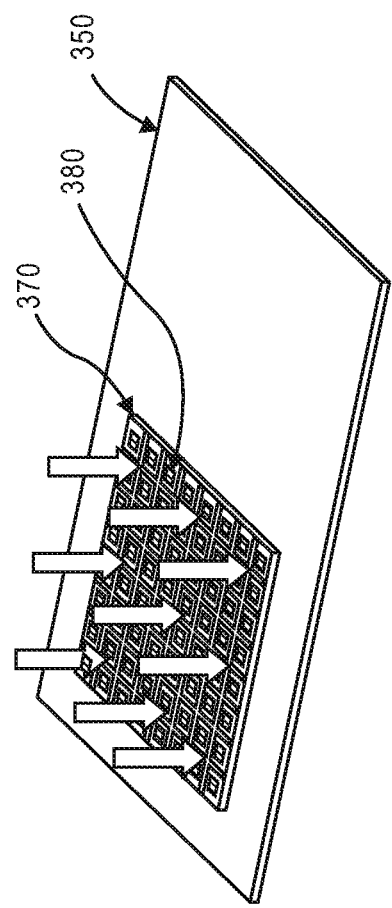
FIG. 3D is a perspective view illustration of a mmWave transceiver being reflown with the addition of pressure to mount the RF module to the mainboard, according to an embodiment of the invention.

Referring now to FIG. 3D, a perspective view of the system is shown during a reflow of the BGA balls, according to an embodiment of the invention. As noted above, the reflow may be accompanied by the application of pressure (as indicated by the arrows) to the RF module in order to allow the dies to compress the TIM layer 341. In an embodiment, the applied pressure may be between approximately 1 gram of downward force and 2000 grams of downward force. Embodiments of the invention may include applying the downward force throughout the reflow process. In alternative embodiments, the downward force may be applied for a period shorter than the reflow of the BGA balls.

It is to be appreciated that the application of downward force during the reflow process may also alter the shape of the BGA balls. Particularly, the downward force in conjunction with the warpage inherent in the reflow process may result in solder bridging between the BGA balls and/or the formation of non-contact opens (NCOs). Accordingly, the size of the BGA balls may be chosen in order to minimize these manufacturing defects. Generally, the BGA balls need to be large enough to minimize the chance of a NCO, but small enough to minimize the chance of solder bridging. In an embodiment, BGA balls between approximately 500 μm and 750 μm may provide sufficient protection from these defects. In an particular embodiment, BGA balls between approximately 630 μm and 700 μm may provide sufficient protection from these defects.

Figure 4:
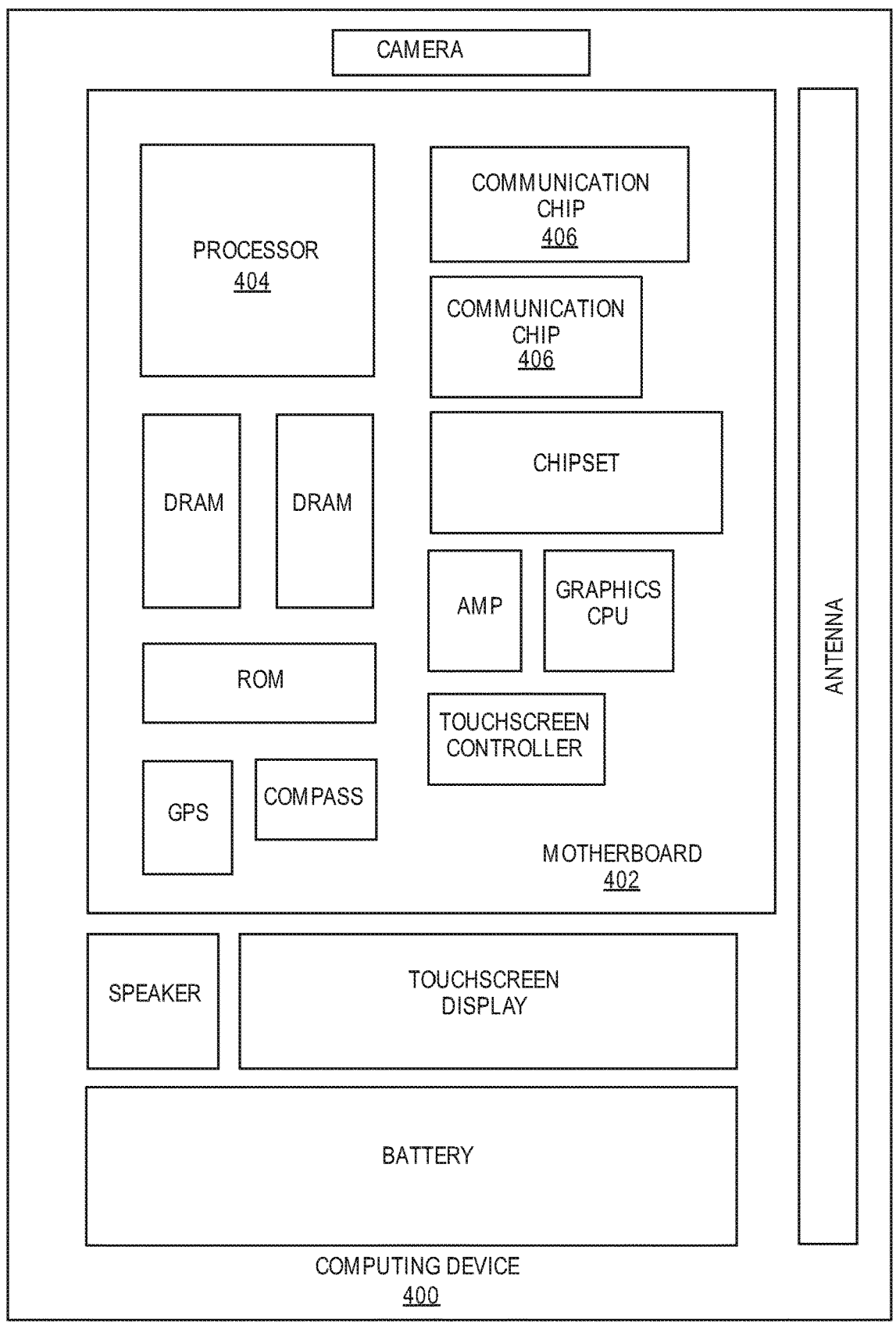
FIG. 4 is a schematic of a computing device built in accordance with an embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may include a die that is mounted to an RF module and thermally coupled to a thermal feature integrated in the mainboard, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may include a die that is mounted to an RF module and thermally coupled to a thermal feature integrated in the mainboard, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 a mmWave transceiver, comprising: an RF module, wherein the RF module comprises: a package substrate; a plurality of antennas formed on the package substrate; and a die attached to a surface of the package substrate; and a mainboard mounted to the RF module with one or more solder balls, wherein a thermal feature is embedded within the mainboard, and wherein the thermal feature is separated from the die by a thermal interface material (TIM) layer.

Example 2 the mmWave transceiver of Example 1, wherein the thermal feature is a slug that passes completely through the mainboard.

Example 3 the mmWave transceiver of Example 1, wherein the thermal feature is a plurality of vias that pass completely through the mainboard.

Example 4 the mmWave transceiver of Example 1, Example 2, or Example 3 further comprising: a heat spreader attached to the mainboard, wherein the heat spreader is coupled to the thermal feature.

Example 5 the mmWave transceiver of Example 4, wherein the heat spreader is coupled to the thermal feature by a second TIM layer.

Example 6 the mmWave transceiver of Example 4, wherein the heat spreader is directly attached to the thermal feature.

Example 7 the mmWave transceiver of Example 1, Example 2, Example 3, Example 4, Example 5, or Example 6, further comprising a plurality of dies and a plurality of thermal features, wherein each die is positioned over one of the thermal features.

Example 8 the mmWave transceiver of Example 1, Example 2, Example 3, Example 4, Example 5, Example 6, or Example 7, wherein the TIM layer is less than approximately 50 μm thick.

Example 9 the mmWave transceiver of Example 1, Example 2, Example 3, Example 4, Example 5, Example 6, Example 7, or Example 8, wherein the TIM layer is less than approximately 40 μm thick.

Example 10 the mmWave transceiver of Example 1, Example 2, Example 3, Example 4, Example 5, Example 6, Example 7, Example 8, or Example 9, wherein the TIM layer has a thickness that is approximately equal to the average size of filler particles in the TIM layer.

Example 11 the mmWave transceiver of Example 1, Example 2, Example 3, Example 4, Example 5, Example 6, Example 7, Example 8, Example 9, or Example 10, wherein the solder balls are ball grid array (BGA) balls.

Example 12 the mmWave transceiver of Example 1, Example 2, Example 3, Example 4, Example 5, Example 6, Example 7, Example 8, Example 9, Example 10, or Example 11, wherein the solder balls are between approximately 500 μm and 750 μm.

Example 13 the mmWave transceiver of Example 1, Example 2, Example 3, Example 4, Example 5, Example 6, Example 7, Example 8, Example 9, Example 10, Example 11, or Example 12, wherein the solder balls are between approximately 630 μm and 700 μm.

Example 14 a method of forming a mmWave transceiver, comprising: fabricating a mainboard, wherein a plurality of thermal features are embedded within the mainboard; forming a thermal interface material (TIM) layer over the plurality of thermal features; positioning an RF module over the mainboard, wherein the RF module comprises: a plurality of antennas on a package substrate; a plurality of dies on the surface of the package substrate, wherein each of the plurality of dies are aligned over one of the plurality of thermal features and in contact with the TIM layer; and a plurality of solder balls; reflowing the solder balls; and applying pressure to the RF module during the reflowing of the solder balls.

Example 15 the method of Example 14, wherein the plurality of dies compress the TIM layer during the application of pressure to the RF module during the reflowing of the solder balls.

Example 16 the method of Example 14 or Example 15, wherein the compressed TIM layer has a thickness less than approximately 50 μm.

Example 17 the method of Example 14, Example 15, or Example 16, wherein the compressed TIM layer has a thickness less than approximately 40 μm.

Example 18 the method of Example 14, Example 15, Example 16, or Example 17, wherein the compressed TIM layer has a thickness that is approximately equal to an average thickness of filler particles in the TIM layer.

Example 19 the method of Example 14, Example 15, Example 16, Example 17, or Example 18, wherein the thermal features are slugs.

Example 20 the method of Example 14, Example 15, Example 16, Example 17, or Example 18, wherein the thermal features are a plurality of vias.

Example 21 the method of Example 14, Example 15, Example 16, Example 17, Example 18, Example 19, or Example 20, wherein the solder balls are ball grid array (BGA) balls.

Example 22 the method of Example 14, Example 15, Example 16, Example 17, Example 18, Example 19, Example 20, or Example 21, wherein the solder balls are between approximately 500 μm and 750 μm.

Example 23 the method of Example 14, Example 15, Example 16, Example 17, Example 18, Example 19, Example 20, Example 21, or Example 22, wherein the solder balls are between approximately 630 μm and 700 μm.

Example 24 a mmWave transceiver, comprising: an RF module, wherein the RF module comprises: a package substrate; a plurality of antennas formed on the package substrate; and a plurality of dies attached to a surface of the package substrate; a mainboard mounted to the RF module with one or more solder balls, wherein a plurality of thermal features are embedded within the mainboard, wherein the thermal features are slugs and/or vias, and wherein the thermal features are separated from the dies by a thermal interface material (TIM) layer; and a heat spreader attached to the mainboard, wherein the heat spreader is coupled to the thermal feature.

Example 25 the mmWave transceiver of Example 24, wherein the TIM layer is less than approximately 40 μm thick.

What is claimed is:
1. A mmWave transceiver, comprising:
   an RF module, wherein the RF module comprises:
      a package substrate;
      a plurality of antennas formed on the package substrate;
      a first die attached to a surface of the package substrate; and
      a second die attached to the surface of the package substrate; and
   a mainboard mounted to the RF module with a plurality of solder balls, wherein a thermal feature is embedded within the mainboard, wherein the thermal feature is separated from the first die and the second die by a thermal interface material (TIM) layer, and wherein the first die and the second die are within a region inside of a footprint of the plurality of solder balls.
2. The mmWave transceiver of claim 1, wherein the thermal feature is a slug that passes completely through the mainboard.
3. The mmWave transceiver of claim 1, wherein the thermal feature is a plurality of vias that pass completely through the mainboard.

4. The mmWave transceiver of claim 1, further comprising:
a heat spreader attached to the mainboard, wherein the heat spreader is coupled to the thermal feature.

5. The mmWave transceiver of claim 4, wherein the heat spreader is coupled to the thermal feature by a second TIM layer.

6. The mmWave transceiver of claim 4, wherein the heat spreader is directly attached to the thermal feature.

7. The mmWave transceiver of claim 1, wherein the TIM layer is less than approximately 50 µm thick.

8. The mmWave transceiver of claim 7, wherein the TIM layer is less than approximately 40 µm thick.

9. The mmWave transceiver of claim 1, wherein the TIM layer has a thickness that is approximately equal to the average size of filler particles in the TIM layer.

10. The mmWave transceiver of claim 1, wherein the solder balls are ball grid array (BGA) balls.

11. The mmWave transceiver of claim 10, wherein a height of the plurality of solder balls is between approximately 500 µm and 750 µm.

12. The mmWave transceiver of claim 11, wherein the height of the plurality of solder balls is between approximately 630 µm and 700 µm.

13. A mmWave transceiver, comprising:
an RF module, wherein the RF module comprises:
 a package substrate;
 a plurality of antennas formed on the package substrate;
 a plurality of dies attached to a surface of the package substrate;
a mainboard mounted to the RF module with a plurality of solder balls, wherein a plurality of thermal features are embedded within the mainboard, wherein the thermal features are slugs and/or vias, wherein the thermal features are separated from the plurality of dies by a thermal interface material (TIM) layer, and wherein the plurality of dies is within a region inside of a footprint of the plurality of solder balls; and
a heat spreader attached to the mainboard, wherein the heat spreader is coupled to the thermal feature.

14. The mmWave transceiver of claim 13, wherein the TIM layer is less than approximately 40 µm thick.

\* \* \* \* \*